(12) United States Patent
Jung et al.

(10) Patent No.: US 11,765,819 B2
(45) Date of Patent: Sep. 19, 2023

(54) MULTIPLE IN-MOLD ELECTRONICS STRUCTURE AND METHOD OF MANUFACTURING THE SAME

(71) Applicant: INTOPS CO., LTD., Anyang-si (KR)

(72) Inventors: Sung-hoon Jung, Anyang-si (KR); Tae yong Hong, Anyang-si (KR)

(73) Assignee: INTOPS CO., LTD., Anyang-si (KR)

( * ) Notice: Subject to any disclaimer, the term of this patent is extended or adjusted under 35 U.S.C. 154(b) by 177 days.

(21) Appl. No.: 17/399,120

(22) Filed: Aug. 11, 2021

(65) Prior Publication Data

US 2023/0020151 A1     Jan. 19, 2023

(30) Foreign Application Priority Data

Jul. 19, 2021   (KR) .................. 10-2021-0094326

(51) Int. Cl.
*H05K 1/02*   (2006.01)
*H05K 3/00*   (2006.01)
*H05K 3/18*   (2006.01)

(52) U.S. Cl.
CPC ......... *H05K 1/0284* (2013.01); *H05K 3/0064* (2013.01); *H05K 3/18* (2013.01); *H05K 2201/09045* (2013.01); *H05K 2201/10106* (2013.01); *H05K 2201/10121* (2013.01)

(58) Field of Classification Search
CPC ...... H05K 1/0284; H05K 3/0064; H05K 3/18; H05K 2201/09045; H05K 2201/10106; H05K 2201/10121
See application file for complete search history.

(56) References Cited

U.S. PATENT DOCUMENTS

| | | | |
|---|---|---|---|
| 7,621,654 B2* | 11/2009 | Nishimoto | H01L 24/97 362/249.02 |
| 10,788,615 B2* | 9/2020 | Gipson | G02B 6/0021 |
| 2018/0220534 A1* | 8/2018 | Heikkinen | H01L 33/52 |
| 2019/0069409 A1* | 2/2019 | Keranen | H05K 3/284 |
| 2019/0101269 A1* | 4/2019 | Inayoshi | H05K 1/141 |
| 2020/0396840 A1* | 12/2020 | Grandia | B32B 27/08 |
| 2021/0183940 A1* | 6/2021 | van der Sijde | H01L 27/156 |

FOREIGN PATENT DOCUMENTS

JP              2012-28564 A      3/2017

* cited by examiner

*Primary Examiner* — Hoa C Nguyen
(74) *Attorney, Agent, or Firm* — KORUS Patent, LLC; Seong Il Jeong (57) ABSTRACT

Disclosed herein is an in-mold electronics (IME) structure. The IME structure includes a film, a first plastic resin positioned under the film, and a second plastic resin positioned under the first plastic resin. An electronic circuit is formed on a top or bottom surface of the second plastic resin by a plating method and also electronic elements are mounted thereon. The electronic elements include LED light sources, a plurality of protruding light guides configured to guide lighting through distribution and direction is formed on the top surface of the second plastic resin, and the LED light sources are installed in respective spaces provided by the light guides.

9 Claims, 7 Drawing Sheets

INJECTION MOLDING

COATING

FIG. 8C

PLATING DEPOSITION

FIG. 8D

ETCHING

FIG. 8E

PAINTING

MULTIPLE IN-MOLD ELECTRONICS STRUCTURE AND METHOD OF MANUFACTURING THE SAME

CROSS-REFERENCE TO RELATED APPLICATION

This application claims the benefit of Korean Patent Application No. 10-2021-0094326 filed on Jul. 19, 2021, which is hereby incorporated by reference herein in its entirety.

BACKGROUND

1. Technical Field

The present invention relates to a multiple in-mold electronics (IME) structure using an electronic circuit plating method, and a method of manufacturing the same.

2. Description of the Related Art

In-mold electronics (IME) technology has emerged relatively recently as technology for realizing 3D shapes and functions by integrating printed conductive ink and an in-mold decoration technique. In the automobile field, Ford first commercialized an overhead console in 2012, and IME technology has developed rapidly since then and is now expanding to home appliances, medical equipment, consumer stores, portable electronic devices, and defense and aviation fields.

IME technology usually includes the first step of printing a decoration, a touch control unit, or an antenna on a plastic film, the second step of surface mounting various electronic components on the film, the third step of thermoforming the film into a 3D shape, and the step of integrating the 3D film with a plastic resin through insert molding. A finished product manufactured in this way is mounted to be recognized as a beautiful exterior film on the dashboard or door trim of a driver's seat, e.g., in the automotive field, and may be used to open a car door or to selectively raise and lower a window by touching the film with an operation similar to the touch operation of a smartphone or a push operation. IME products have several advantages such as the advantages of providing most of the electrical/electronic functions required by automobiles, not requiring mechanical parts such as buttons, knobs, links, shafts, or motors, saving space, and providing well-designed exteriors In the related art regarding IME, a manufacturing process using two films is performed as follows:

First, a design is printed on an upper film A, and then the upper film A is molded into a predetermined shape and cut. The design is not limited to a decoration, a logo, an emblem, or a button design showing the operation or function of an item.

Separately, an electronic circuit is printed on a lower film B with conductive ink, electronic elements are mounted to on the lower film B and bonded to the lower film B through a reflow method, and the lower film B is formed and cut into the same shape as the upper film A.

In addition, the upper film A, a plastic resin, and the lower film B are insert-injection-molded into a final product.

However, according to this method, there are many restrictions on the configuration of the conductive circuit depending on the shape of the lower film B, and also there is a disadvantage in that the process is considerably complicated.

As for related patents regarding IME, Korean Patent Application Publication No. 10-2016-0094936 discloses a technology that forms a film, forms a conductor and graphics on the film, attaches electronic elements onto the film, and then performs injection molding into a three-dimensional shape. Korean Patent Application Publication No. 10-2017-0130395 discloses a technology that screen-prints a conductor on a substrate, mounts electronic elements, and then performs injection molding into a three-dimensional shape. US Patent Publication No. 2018-0213651 discloses the process of forming a three-dimensional structure by forming a conductive circuit on a film, mounting electronic elements on the film, and then thermoforming the film. These patents have limitations in that they disclose a general technology that mounts an electronic circuit pattern and electronic elements on a single film and forms the film.

In view of the above-described related art and patents, the inventors have proposed an IME structure in which a film configured such that a design is formed thereon, a first plastic resin located under the film, and a second plastic resin located under the first plastic resin are included, an electronic circuit is formed on the upper surface or both surfaces of the second plastic resin using a plating method and also electronic elements are mounted thereon, and the film, the first plastic resin, and the second plastic resin configured such that the electronic circuit and the electronic elements are formed thereon are integrated with each other in Korean Patent Application No. 10-2020-0174369 filed on Dec. 14, 2020. This structure may further include a terminal unit electrically connected to a part of the electronic circuit and extending downward through the through hole of the second plastic resin.

The present invention intends to further improve the above structure in various aspects.

SUMMARY

Therefore, an object of the present invention is to provide a solid and durable IME structure that can be applied to automobiles and home appliances, and an IME structure that can efficiently control light emitted from an LED element based on the above structure.

According to an aspect of the present invention, there is provided an in-mold electronics (IME) structure including a film, a first plastic resin positioned under the film, and a second plastic resin positioned under the first plastic resin, wherein an electronic circuit is formed on a top or bottom surface of the second plastic resin by a plating method and also electronic elements are mounted thereon, and wherein the electronic elements include an light-emitting diode (LED), an integrated circuit (IC) chip, a resistor chip, a capacitor, a switch device configured to selectively turns on and off by a touch, a touch drag, an ambient light, and/or a vibration micro-motor for a haptic function.

According to another aspect of the present invention, there is provided an in-mold electronics (IME) structure including a film, a first plastic resin positioned under the film, and a second plastic resin positioned under the first plastic resin, wherein an electronic circuit is formed on a top or bottom surface of the second plastic resin by a plating method and also electronic elements are mounted thereon, and wherein the electronic elements include LED light sources, a plurality of protruding light guides configured to guide lighting through distribution and direction is formed on the top surface of the second plastic resin, and the LED light sources are installed in respective spaces provided by the light guides.

An assembly member protruding outward may be formed on the second plastic resin, an accommodation portion may be formed on the opposite surface of the first plastic resin to mate with the assembly member, and the first and second plastic resins may be assembled together by using the assembly member and the accommodation portion.

An adhesive layer may be formed on the top surface of the second plastic resin, and the first and second plastic resins may be bonded together by using the adhesive layer.

An encapsulant or a lens may be formed on the second plastic resin to surround each of the LED elements, thereby providing an encapsulated structure.

A pattern portion having a curved shape and fine protrusions and depressions at a position opposite to each of the LED elements may be formed through the bottom surface of the first plastic resin.

A pattern part may be formed on the inner sides of the light guides surrounding each of the LED elements.

The base of the first plastic resin may be completed by an injection molding process to form a design on the first plastic resin, the surface of the base may be coated, a metal layer may be formed through deposition and plating processes to form a design having a predetermined shape, the metal layer may be etched to match the shape of the design, and then painting work may be performed. In this case, an assembly member protruding outward may be formed on the second plastic resin, an accommodation portion may be formed on the opposite surface of the first plastic resin to mate with the assembly member, and the first and second plastic resins may be assembled together by using the assembly member and the accommodation portion, or an adhesive layer may be formed on the top surface of the second plastic resin, and the first and second plastic resins may be bonded together by using the adhesive layer.

An assembly member may be formed on the first plastic resin, an accommodation portion may be formed on an opposite surface of the second plastic resin to mate with the assembly member, and the first and second plastic resins may be assembled together by using the assembly member and the accommodation portion.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION

Each embodiment according to the present invention is only an example intended to help understanding of the present invention, and the present invention is not limited to such embodiments. The present invention may be composed of a combination of at least any one of individual components and functions included in individual embodiments.

<IME Structure 1>

Figure 1A:
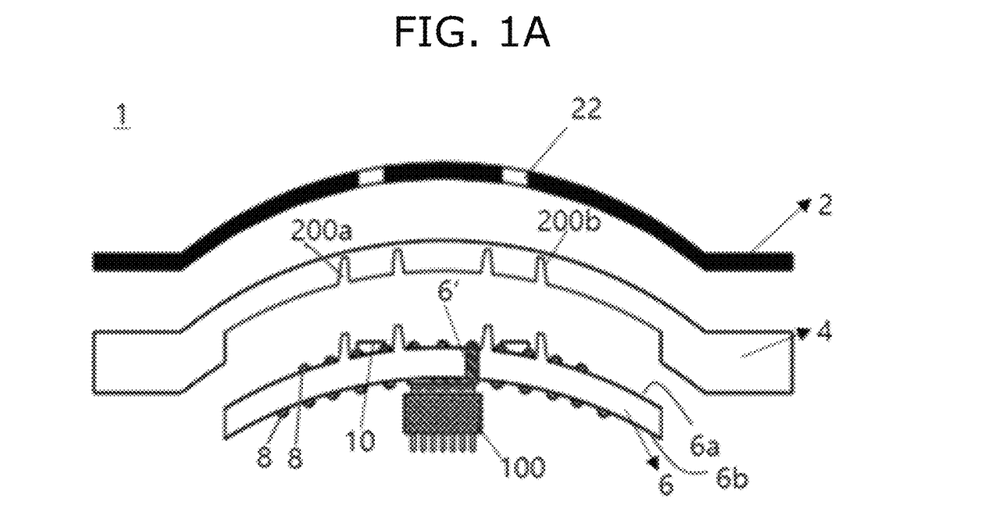
FIG. 1A is a sectional view showing the components of an IME structure according to the present invention before assembly.
Figure 1B:
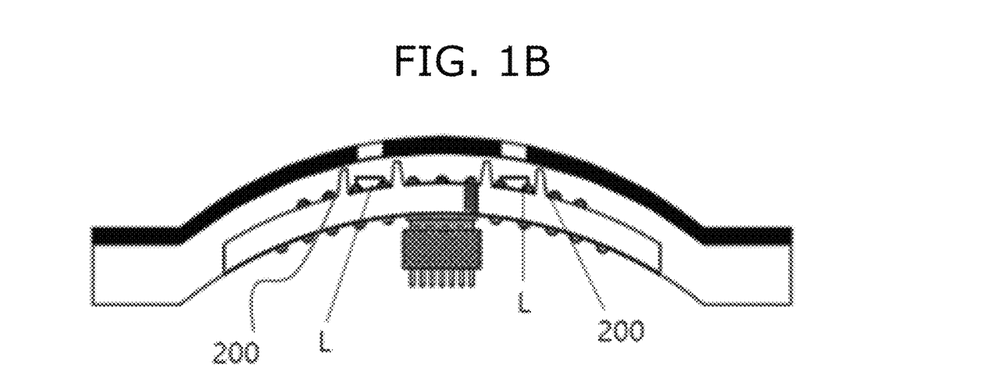
FIG. 1B is a sectional view of the IME structure of FIG. 1A after assembly.

FIG. 1A is a sectional view showing the components of an IME structure 1 according to the present invention before assembly, and FIG. 1B is a sectional view of the IME structure 1 of FIG. 1A after assembly. Although the IME structure 1 may be applied to any field such as the automobile field, the home appliance field, or the mobile phone field, the following description will be given on the assumption that the IME structure 1 is mainly applied to the automobile field.

The IME structure 1 includes a film 2, a first plastic resin 4 positioned under the film 2, and a second plastic resin 6 positioned under the first plastic resin 4 sequentially from the top thereof. An electronic circuit 8 and electronic elements 10 are formed on the upper surface 6a and/or lower surface 6b of the second plastic resin 6. The IME structure 1 is a structure into which the film 2 configured such that a design is formed thereon, the first plastic resin 4, and the second plastic resin 6 configured such that the electronic circuit 8 and the electronic elements 10 are formed thereon are integrated.

A design such as a decoration, a logo, an emblem, and/or a button icon showing the operation and function of an item is formed on the film 2. As for the material of the film 2, various materials such as PC, PMMA, PET, and TPU may be applied, and there is no limitation. Although the film 2 is shown as having as a whole a disk shape in which the center thereof is a convex curved surface and the left and right sides thereof are flat as an example, it is not limited thereto. One or more through portions 22 are formed in a printed layer or a design component layer to allow transmission through the illumination portion of the film 2. The light of the electronic element 10 such as an LED may be emitted through the through portions 22.

The first plastic resin 4 has a strong and thick structure in which the shape thereof is generally similar to the shape of the film 2, the top surface thereof is coupled to the bottom surface of the film 2, and the height of the sides thereof is sufficiently large so the first plastic resin 4 completely encloses and seals the overall top surface 6a and side surfaces of the second plastic resin 6. The type of resin may be any of plastic-based resins such as PC, acrylic, ABS, AES, PMMA, PI, and PPA, and is not limited thereto.

The electronic circuit 8 includes a circuit pattern, a cable, and/or a conductive ink configured to supply current or power to the electronic elements 10, but is not limited thereto. The electronic circuit 8 may be formed on both the top and bottom surfaces 6a and 6b of the second plastic resin 6.

The electronic elements 10 include a capacitive sensor, a chip, a processor, an electric switch, and the like, and any of them may be appropriately selected and mounted according to the purpose of the IME structure 1. It may also be possible to mount a switch device configured to selectively turn on and off the LED element L by a capacitive method with a touch part placed on the film 2 as the electronic element 10 or to mount a vibration micro-motor for a haptic function as the electronic element 10.

A terminal unit 100 that is electrically connected to a part of the electronic circuit 8 for the purpose of connection between the electronic circuit 8 and a main board (not shown) and is connected to the part of the electronic circuit formed on the top surface 6a of the second plastic resin 6 through a through hole 6' is mounted on the bottom surface 6b of the second plastic resin 6.

In the following description, a case in which the electronic elements 10 are LED elements L, which are light sources, will be described.

In the embodiment of the present invention, protrusion-shaped light guides 200 extending upwardly and guiding the distribution and direction of illumination are formed on the top surface of the second plastic resin 6. In addition, the LED elements L are mounted in a space provided between the two light guides 200 on the left side and in space between the two light guides 200 on the right side, respectively. The light guides 200 guide the light, emitted from the LED elements L, toward the through portions 22 in straight lines without being scattered around it. The shape and number of the light guides 200 do not limit the scope of the present invention, and are appropriately selected according to the LED element L. A plurality of guide accommodation portions 200a configured to accommodate the light guides 200 is formed through the bottom surface of the first plastic resin 4.

The process of manufacturing the IME structure 1 of the present invention is preferably a double insert injection process of the film 2, the first plastic resin 4, and the second plastic resin 6. The IME structure 1 is completed in an integrated form by injection molding the first and second plastic resins 4 and 6 to fit the shape of a final product and to appropriately implement the light guides 200 and the guide accommodation portions 200a three-dimensionally, placing the film 2 thereon, and then supplying resin into the mold (see FIG. 1B).

Figure 2A:
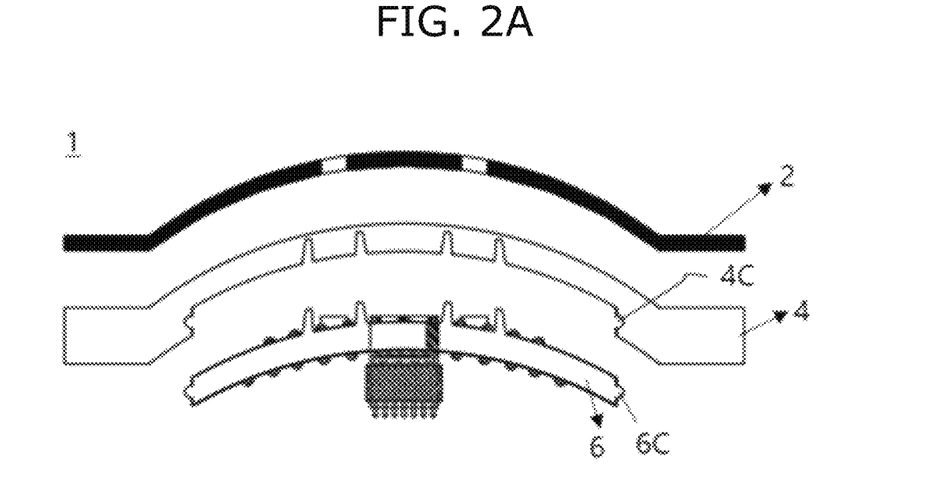
FIG. 2A is a sectional view showing the components of an IME structure according to another embodiment of the present invention before assembly.
Figure 2B:
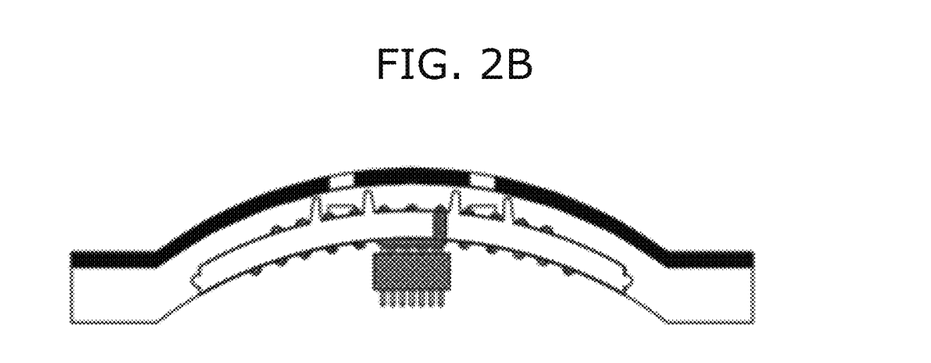
FIG. 2B is a sectional view of the IME structure of FIG. 2A after assembly.

The IME structure 1 of the present invention may be manufactured according to another embodiment shown in FIGS. 2A and 2B. This structure is different from that of FIG. 1 in that hook accommodation portions 4c are formed through the inner side surfaces of a first plastic resin 4 and hooks 6c are formed on the side surfaces of a second plastic resin 6 to mate with the hook accommodation portions 4c. Then, in addition to the double injection molding structure, the first and second plastic resins 4 and 6 may be firmly integrated with each other by adding an assembly coupling structure based on assembly using the hooks 6c and the hook accommodation portions 4c. A screw fastening method may be selectively applied by implementing bosses instead of the hooks. Assembly members such as hooks and accommodation portions that abut against or accommodate the assembly members may be based on a method appropriately selected from a screw thread method and a forced press-fit method. In addition, as still another modification, it may also be possible to assemble the first and second plastic resins by forming assembly members in a first plastic resin and forming accommodation portions through the opposite surface of a second plastic resin to mate with them.

Figure 3A:
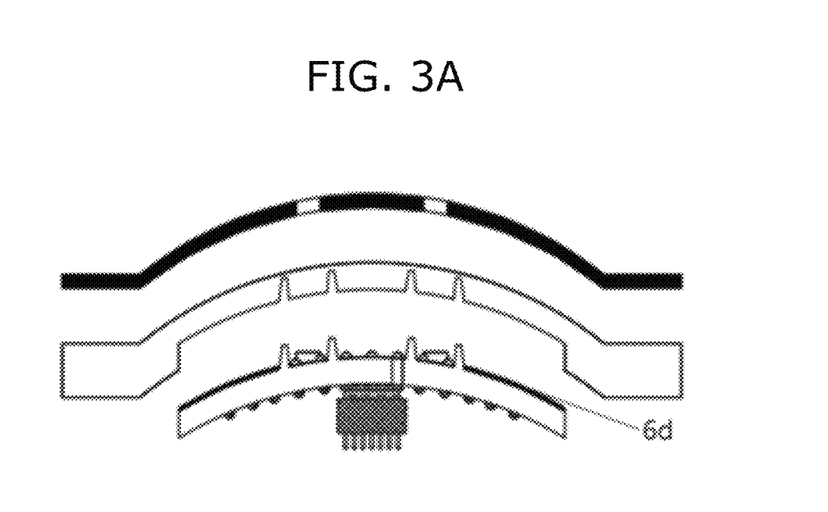
FIG. 3A is a sectional view showing the components of an IME structure according to still another embodiment of the present invention before assembly.
Figure 3B:
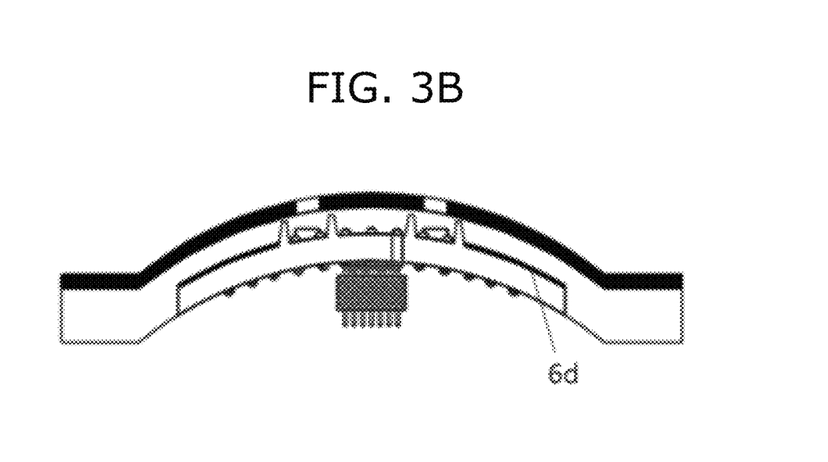
FIG. 3B is a sectional view of the IME structure of FIG. 3A after assembly.

The IME structure 1 of the present invention may be manufactured according to another embodiment shown in FIGS. 3A and 3B. This structure is different from that of FIG. 1 in that an adhesive layer 6d is formed on the top surface 6a of a second plastic resin 6. Then, in addition to a double injection molding structure, first and second plastic resins 4 and 6 may be firmly integrated with each other by adding an adhesive bonding structure based on bonding using the adhesive layer 6d.

<Encapsulated Structure of the Light Source Unit in the IME Structure 1>

Next, the encapsulated structure of the LED element L of the present invention will be described with reference to FIGS. 4 and 5. This structure may be applied to the IME structures 1 of FIGS. 1 to 3.

Figure 4:
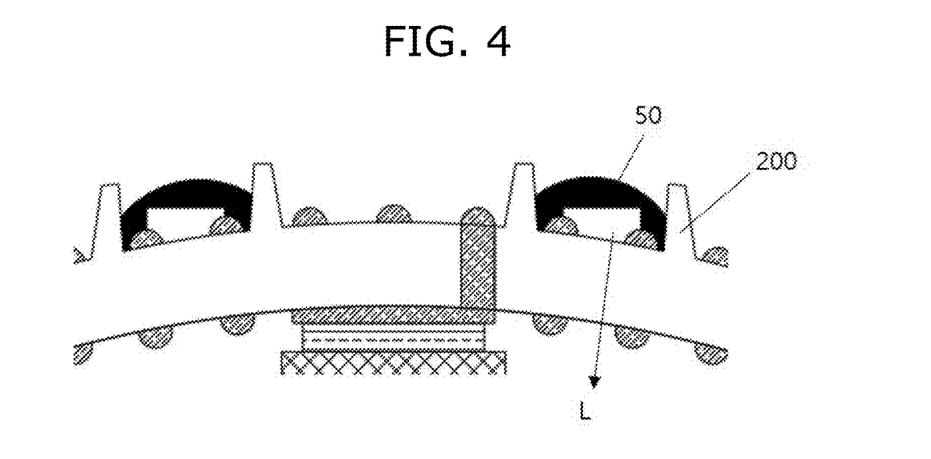
FIG. 4 is a sectional view showing an encapsulated structure according to an embodiment of the present invention.

In FIG. 4, an encapsulant 50 surrounds the LED element L disposed between the light guides 200 on the top surface 6a of the second plastic resin 6 to form an encapsulated structure. The encapsulant 50 may be made of various materials, such as epoxy, silicon, and ceramic, and may be adhered to the LED element L. The encapsulant 50 is manufactured by dispensing an appropriate amount at a desired point using dispensing equipment and undergoing one of various curing processes such as thermal curing or UV curing.

Figure 5:
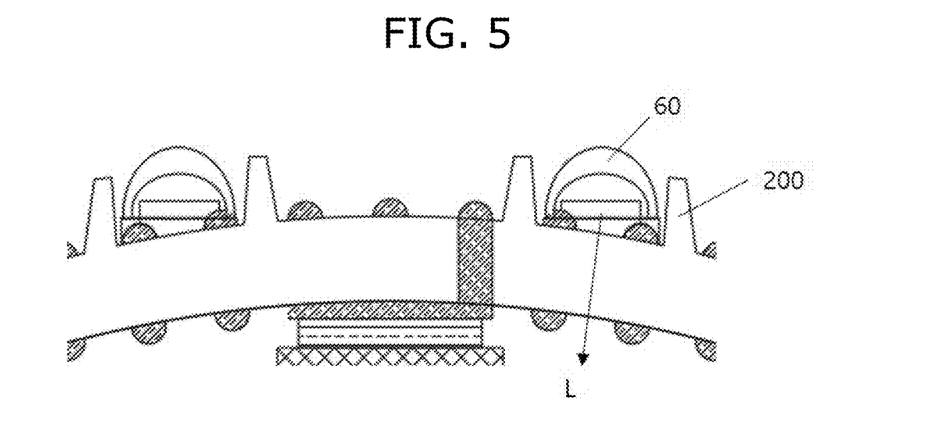
FIG. 5 is a sectional view showing an encapsulated structure according to another embodiment of the present invention.

In FIG. 5, a lens 60 surrounds the LED element L disposed between the light guides 200 on the top surface 6a of the second plastic resin 6 to form an encapsulated structure. The lens 60 may be made of any material that can be injection molded, and the shape and structure of the lens 60 may be changed according to specifications. The lens 60 may be formed in an assembly or bonding-based adhesive manner at a desired point.

According to the present invention, due to the encapsulated structure, there are provided the excellent effects of protecting the components including the LED element L from heat or pressure, imparting a diffusion function to light, and adjusting a propagation angle such as the distribution of light.

<Optical Pattern Structure in the IME Structure 1>

Next, an example in which an optical pattern structure is introduced as another embodiment of the present invention will be described.

Figure 6A:
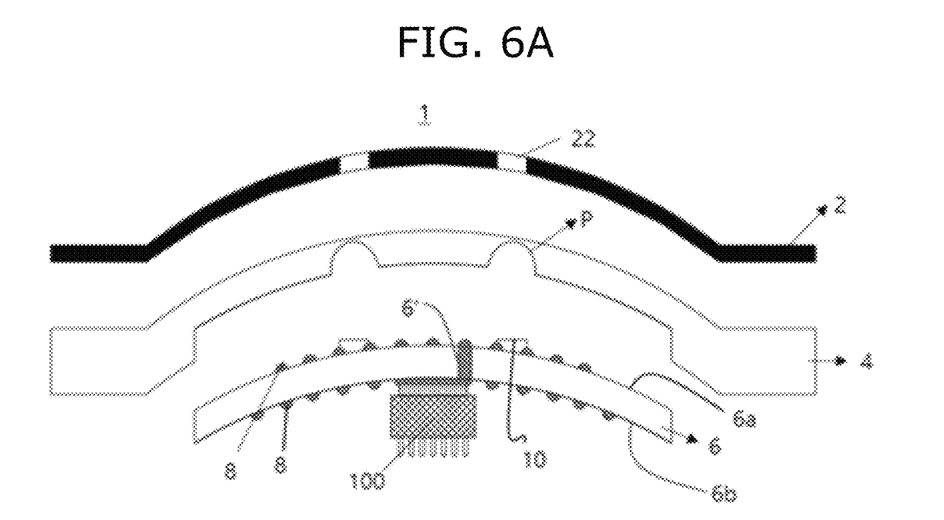
FIG. 6A is a cross-sectional view of an IME structure 1 having an optical pattern structure according to the present invention before assembly.
Figure 6B:
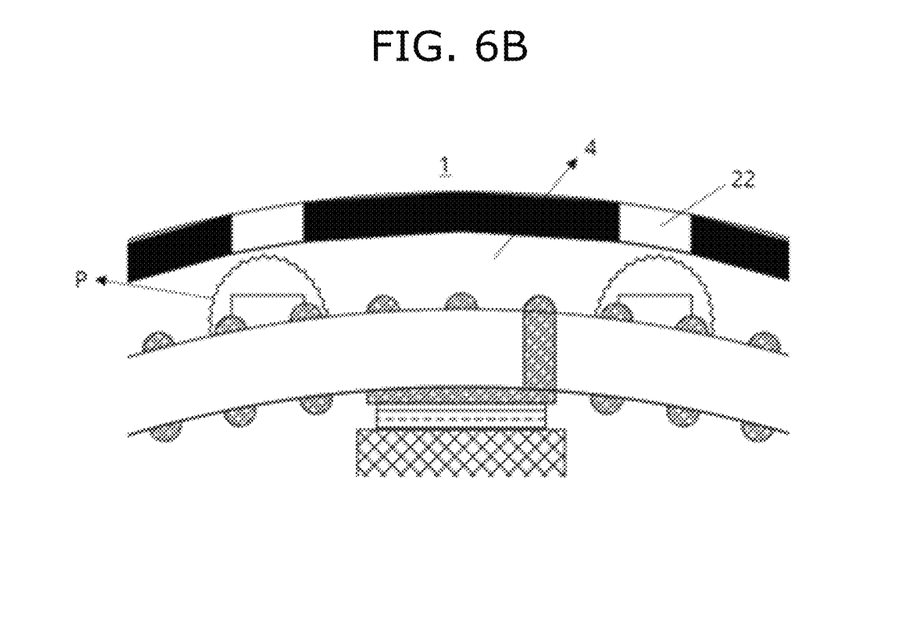
FIG. 6B is a cross-sectional view of the IME structure 1 after assembly.

FIG. 6A is a cross-sectional view of an IME structure 1 having an optical pattern structure according to the present invention before assembly, and FIG. 6B is a cross-sectional view of the IME structure 1 after assembly.

Hemispherical pattern portions P formed concave upward at positions on the bottom surface of the first plastic resin 4 opposite to the LED elements L of the second plastic resin 6 form curved surfaces. Fine protrusions and depressions are formed on the surfaces of the pattern portions P. When the first and second plastic resins 4 and 6 are combined with each other, the pattern portions P are positioned to surround the LED elements L, as shown in the drawings. Due to the pattern portions P, effects such as the direction, scattering, concentration, reflection, and diffusion of light may be appropriately adjusted and controlled. The shape of the pattern portions P may be manufactured in various ways by taking into consideration a desired light effect, and may be applied to products exposed to the outside or the inside, such as an indoor auxiliary light. In addition, the protrusions and depressions may be variously manufactured in pointed tip shapes or hemispherical shapes. Next, FIG. 7 shows a cross-sectional view of the second plastic resin 6 of an IME structure 1 having an optical pattern structure according to another embodiment of the present invention.

Figure 7:
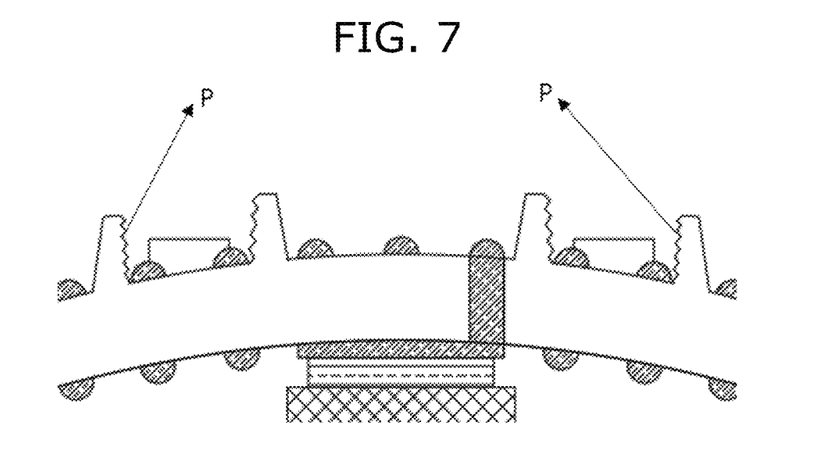
FIG. 7 shows a cross-sectional view of the second plastic resin 6 of an IME structure 1 having an optical pattern structure according to another embodiment of the present invention.

In FIG. 7, pattern portions P are formed on the inner side surfaces of light guides 200 surrounding LED elements L, unlike in FIG. 6. Fine protrusions and depressions are formed on the surfaces of the pattern portions P. In this case, as light passes through each of the pattern portions P, a plurality of parallel rays of light gathers as a single ray and travels to the side, so that the effect of the side diffusion of light may be expected. The structure of FIG. 7 also exhibits the same effect as the structure of FIG. 6

<Design Implementation Structure in the IME Structure 1>

Although the design has been described as being formed on the film 2 in FIG. 1, it is possible to form the design on the first plastic resin 4 according to another embodiment of the present invention. FIGS. 8A to 8(e) are views sequentially illustrating a manufacturing process of forming a design on the first plastic resin 4 of the present invention and perspective views of the first plastic resin 4 according to respective processes.

Figure 8A:
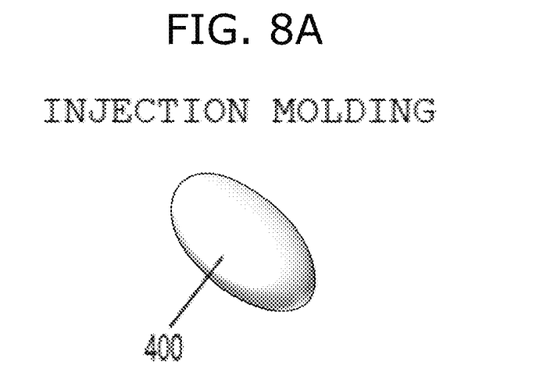
FIGS. 8A to 8E are views sequentially illustrating a manufacturing process of forming a design on the first plastic resin of the present invention and perspective views of the first plastic resin according to respective processes.

First, the base 400 of the first plastic resin 4 is completed through an injection molding process. The material of the base 400 includes all moldable plastic resins including PC, PMMA (acrylic), ABS, AES, and the like.

Figure 8B:
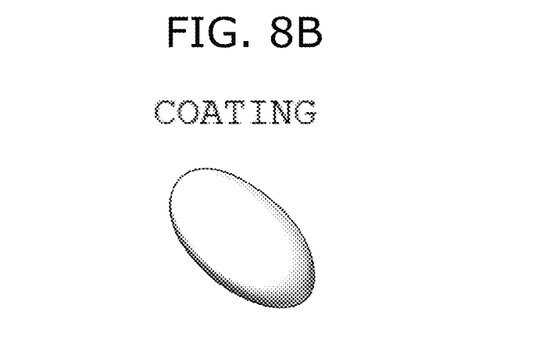

Next, a coating layer is formed by performing a coating operation on the surface of the base 400. The coating operation is performed by several processes including primer coating, or one top coating is performed. The top coating is performed by applying a transparent paint as a sealing material onto an underlying material, and is intended to protect the outer surface of a product and to prevent deformation due to exposure to sunlight.

Figure 8C:
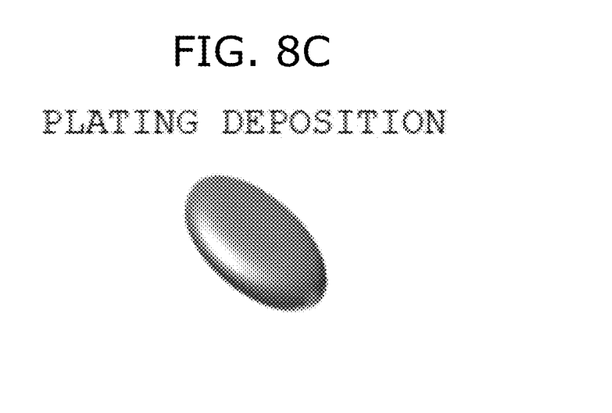

Next, a metal layer is formed on the first plastic resin 4 using a metal such as indium (In), aluminum, or nickel to implement a predetermined design. The metal layer may be formed by a deposition or plating process.

Figure 8D:
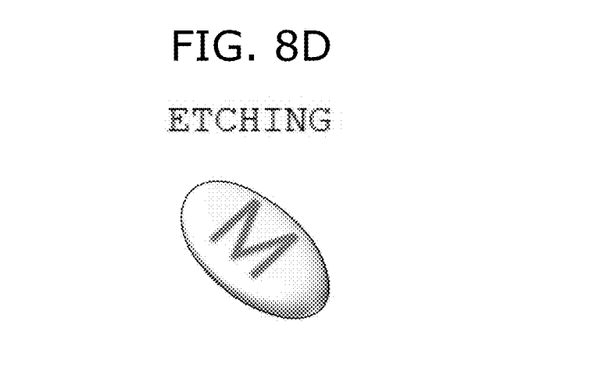

Next, the metal layer formed by the deposition or plating process is etched to match the shape of the design by using, e.g., a laser. In the example of FIG. 8(d), the overall metal layer except for the design of "M" is etched away.

Figure 8E:
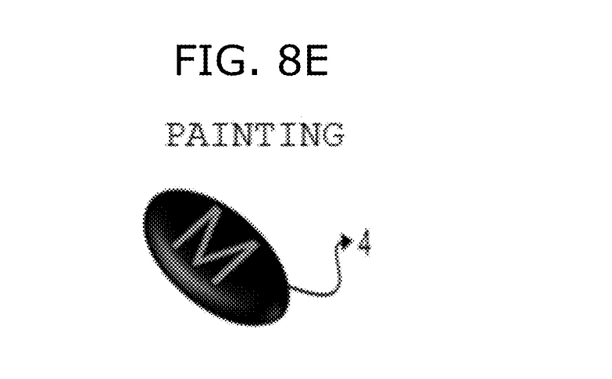

Finally, a painting operation is performed using a paint to realize esthetic color (see FIG. 8(e)).

In order to complete the IME structure 1, the first plastic resin 4 and the second plastic resin 6 in which the design is implemented may be combined with each other through an assembling or bonding process described based on FIGS. 2 and 3.

The above-described design manufacturing process may be applied to all embodiments of the present invention described above.

The present invention has the effects of providing the improved IME structure that provides a simplified process compared to the related art, implements an electronic circuit on the surface of the plastic resin to which the plating method is applied to minimize limitations attributable to the shape of a product, is robust, has good bonding strength, has strong durability, and realizes various light patterns by providing a structure that can guide and adjust lighting when the electronic elements are LED light sources, and also providing the method of manufacturing the improved IME structure.

Although the embodiments of the present invention have been described above, the present invention is not limited thereto, and various modifications and variations may be made to the present invention. It is obvious that the scope of the present invention extends to scopes identical or equivalent to the attached claims.

What is claimed is:

1. An in-mold electronics (IME) structure comprising:
a film,
a first plastic resin positioned under the film, and
a second plastic resin positioned under the first plastic resin,
wherein an electronic circuit is formed on a top or bottom surface of the second plastic resin by a plating method and also electronic elements are mounted thereon,
wherein the electronic elements include LED light sources, a plurality of protruding light guides configured to guide lighting through distribution and direction is formed on the top surface of the second plastic resin, and the LED light sources are installed in respective spaces provided by the light guides,
wherein the light guides are formed to surround the LED light sources at a position spaced apart from the LED light sources, and protruded from the top surface of the second plastic resin to a position exceeding a height of the LED light sources so that lighting emitted from a side of the LED light sources is guided and lighting emitted from a top surface of the LED light sources does not pass through the light guides and travels upward, and
wherein a terminal unit that is electrically connected to a part of the electronic circuit formed on the top surface of the second plastic resin through a through hole is mounted on the bottom surface of the second plastic resin.

2. The IME structure of claim 1, wherein an assembly member protruding outward is formed on the second plastic resin, an accommodation portion is formed on an opposite surface of the first plastic resin to mate with the assembly member, and the first and second plastic resins are assembled together by using the assembly member and the accommodation portion.

3. The IME structure of claim 1, wherein an adhesive layer is formed on the top surface of the second plastic resin, and the first and second plastic resins are bonded together by using the adhesive layer.

4. The IME structure of claim 1, wherein an encapsulant or a lens is formed on the second plastic resin to surround each of the LED elements, thereby providing an encapsulated structure.

5. The IME structure of claim 1, wherein a pattern portion having a curved shape and fine protrusions and depressions at a position opposite to each of the LED elements is formed through a bottom surface of the first plastic resin.

6. The IME structure of claim 1, wherein a pattern part is formed on inner sides of the light guides surrounding each of the LED elements.

7. The IME structure of claim 1, wherein a base of the first plastic resin is completed by an injection molding process to form a design on the first plastic resin, a surface of the base is coated, a metal layer is formed through deposition and plating processes to form a design having a predetermined shape, the metal layer is etched to match a shape of the design, and then painting work is performed.

8. The IME structure of claim 7, wherein an assembly member protruding outward is formed on the second plastic resin and an accommodation portion is formed on an opposite surface of the first plastic resin to mate with the assembly member so that the first and second plastic resins are assembled together by using the assembly member and the accommodation portion, or wherein an adhesive layer is formed on the top surface of the second plastic resin, and the first and second plastic resins are bonded together by using the adhesive layer.

9. The IME structure of claim 1, wherein an assembly member is formed on the first plastic resin, an accommodation portion is formed on an opposite surface of the second plastic resin to mate with the assembly member, and the first and second plastic resins are assembled together by using the assembly member and the accommodation portion.

* * * * *